United States Patent
Sizov (10) Patent No.: US 11,923,445 B2
(45) Date of Patent: Mar. 5, 2024

(54) SEMICONDUCTOR CONTACT STRUCTURES

(71) Applicant: X-FAB DRESDEN GMBH & CO. KG, Dresden (DE)

(72) Inventor: Victor Sizov, Dresden (DE)

(73) Assignee: X-FAB DRESDENT GMBH & CO. KG, Dresden (DE)

( * ) Notice: Subject to any disclaimer, the term of this patent is extended or adjusted under 35 U.S.C. 154(b) by 371 days.

(21) Appl. No.: 17/237,763

(22) Filed: Apr. 22, 2021

(65) Prior Publication Data

US 2021/0336041 A1     Oct. 28, 2021

(30) Foreign Application Priority Data

Apr. 23, 2020   (GB) .................................... 2005926

(51) Int. Cl.
*H01L 29/778*     (2006.01)
*H01L 29/20*      (2006.01)
*H01L 29/66*      (2006.01)

(52) U.S. Cl.
CPC ........ *H01L 29/778* (2013.01); *H01L 29/2003* (2013.01); *H01L 29/66462* (2013.01)

(58) Field of Classification Search
CPC ............... H01L 29/778; H01L 29/2003; H01L 29/66462; H01L 29/7786; H01L 29/0843; H01L 29/452; H01L 29/0688
See application file for complete search history.

(56) References Cited

U.S. PATENT DOCUMENTS

| | | | |
|---|---|---|---|
| 9,634,107 B2 | 4/2017 | De Jaeger et al. | |
| 10,505,031 B1 | 12/2019 | Douglas et al. | |
| 2005/0258451 A1 | 11/2005 | Saxler et al. | |
| 2007/0158683 A1 | 7/2007 | Sheppard et al. | |
| 2007/0269968 A1 | 11/2007 | Saxler et al. | |
| 2008/0121895 A1 | 5/2008 | Sheppard et al. | |
| 2013/0299842 A1* | 11/2013 | Prechtl | H01L 29/778 257/194 |
| 2018/0240903 A1* | 8/2018 | Abe | H01L 21/0254 |

OTHER PUBLICATIONS

GB Intellectual Property Office, GB Application No. 2005926.7, 6 pages (dated Oct. 5, 2020).

* cited by examiner

*Primary Examiner* — Shih Tsun A Chou
(74) *Attorney, Agent, or Firm* — Thompson Hine LLP (57) ABSTRACT

A semiconductor contact structure including a two-dimensional electron gas (2DEG) between a first and a second semiconductor layer and a silicon implant extending into at least a part of the first semiconductor layer and into at least a part of the second semiconductor layer and connected to the 2DEG along an interface between the 2DEG and the silicon implant, wherein the interface has a nonlinear shape. The structure further includes a contact connected to the 2DEG via the silicon implant.

15 Claims, 6 Drawing Sheets

SEMICONDUCTOR CONTACT STRUCTURES

This application claims priority to United Kingdom Application No. 2005926.7 filed on Apr. 23, 2020 and entitled SEMICONDUCTOR CONTACT STRUCTURES, the entire contents of which are hereby incorporated by reference.

TECHNICAL FIELD

The invention relates to semiconductor contact structures, and in particular to structures having a contact connected to a two-dimensional gas (2 DEG).

BACKGROUND

High performance and low resistance Ohmic contacts are important for semiconductor electronics. A transistor may comprise a two-dimensional electron gas (2 DEG) as the conduction channel between an aluminum gallium nitride (AlGaN) layer and a gallium nitride (GaN) layer. An issue comes from the necessity of connecting metal electrodes to the 2 DEG which is located 10 to 50 nm below the crystal surface and separated from the surface by an undoped, high resistivity AlGaN barrier.

One of the most popular solutions is to perform high temperature annealing after deposition of the electrode metals. The reaction between metal and the group-III nitride forms a low resistance contact between the 2 DEG and the electrode. Typically, a metal stack containing gold (Au) has to be used to achieve a low resistance of <0.1 ohm*mm.

Unfortunately noble metals such gold are strictly prohibited in complementary metal oxide semiconductor (CMOS) fabrication. This has motivated the development of so called "Gold Free Processes," wherein standard CMOS capable metals are used. Typically a titanium (Ti) and aluminum (Al) metal stack is used, wherein both annealing and a partial or complete AlGaN recess is required (as described in U.S. Pat. No. 9,634,107). Using this approach, a contact resistivity of 0.5 ohm*mm can be achieved.

An alternative approach is to use ion implantation of silicon (Si) into contact regions as suggested in U.S. Patent Application Publication Nos. 2007/0158683, 2007/0269968 and 2008/0121895. After Si ion implantation and annealing, a metal to semiconductor contact resistance as low as 0.06 ohm*mm can be achieved with and Si implant area sheet resistance of about 50 ohm/sq (i.e. 50 ohm per square).

SUMMARY

The present invention provides a semiconductor contact structure as set out in the appended claims.

Certain embodiment will now be described with reference to the accompanying drawings.

DETAILED DESCRIPTION

A problem with the above described Si implantation approach is (Al)GaN crystal damage and AlGaN/GaN interface degradation leading to two-dimensional electron gas (2 DEG) density reduction due to Si implantation. Consequently, the resistance between Si implanted area and the 2 DEG can become significant and could be as high as 0.4 to 0.5 ohm*mm. The overall resistance between metal and 2 DEG will then not be lower than 0.4 to 0.5 ohm*mm, which is not sufficient for some applications like radio frequency (RF) applications, and may also have a significant impact on $R_{on}$ (the on resistance) of power devices.

To at least partly solve this problem, disclosed herein is a semiconductor contact structure, wherein the interface between the Si implant and the 2 DEG is not a straight line, so as to increase the effective length of the interface and thereby reduce the total transition resistance between the Si implant and the 2 DEG.

Typically, the contact structure provides an Ohmic contact to the 2 DEG. An Ohmic contact is a contact having a substantially linear relationship between current and voltage. Embodiments of the Si implant based contacts described herein can improve ohmic contact performance by a factor of two independently of the particular Si implant based process that is used. Because the transition resistance ($R_{tr}$) between the Si implant and the 2 DEG is interface related, an effective increase of interface length per area by having a nonlinear shape can reduce the total resistance.

A nonlinear interface shape can also improve the contact uniformity over the wafer. GaN epitaxy (EPI) has quite strong limitations on the EPI layer thickness and composition uniformity, which can significantly influence $R_{tr}$ uniformity over the wafer. Embodiments described herein can provide smaller variations in the total transition resistance for a given change in the local nominal Mr.

Figure 1:
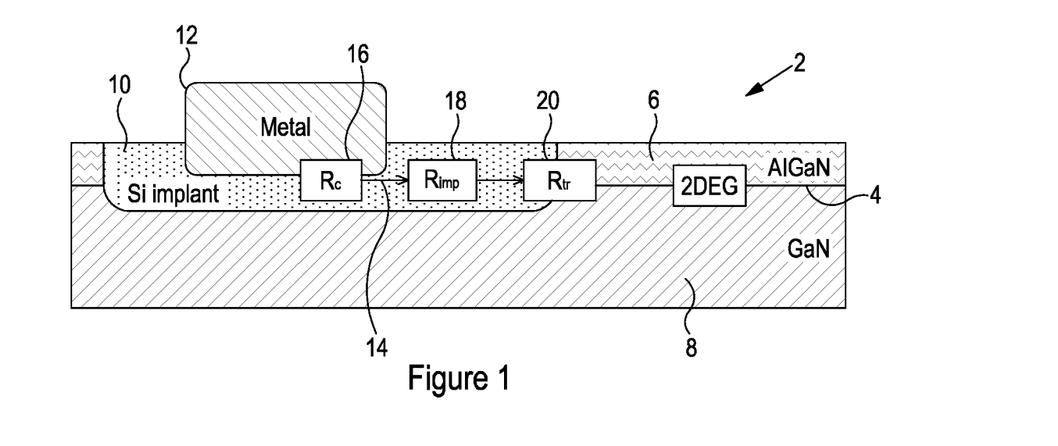
FIG. 1 shows a schematic cross section of a contact structure according to an embodiment.

FIG. 1 shows a schematic cross section of a contact structure 2 according to an embodiment. The contact structure 2 comprises a 2 DEG 4 between a first semiconductor layer 6 comprising AlGaN and a second semiconductor layer 8 comprising GaN, a silicon implant 10 and, a metal contact 12 (e.g. an Ohmic contact) connected to the 2 DEG 4 via the silicon implant 10. The direction of current flow is indicated by arrows 14 in the diagram and the associated resistances at different points in the current path marked out as $R_c$ 16, $R_{imp}$ 18, and $R_{tr}$ 20. $R_c$ 16 is the contact resistance between the metal contact 12 and the silicon implant 10, $R_{imp}$ 18 is the sheet area resistance of the silicon implant 10, and $R_{tr}$ 20 is the resistance of the transition region between the silicon implant 10 and the 2 DEG 4.

Figure 2:
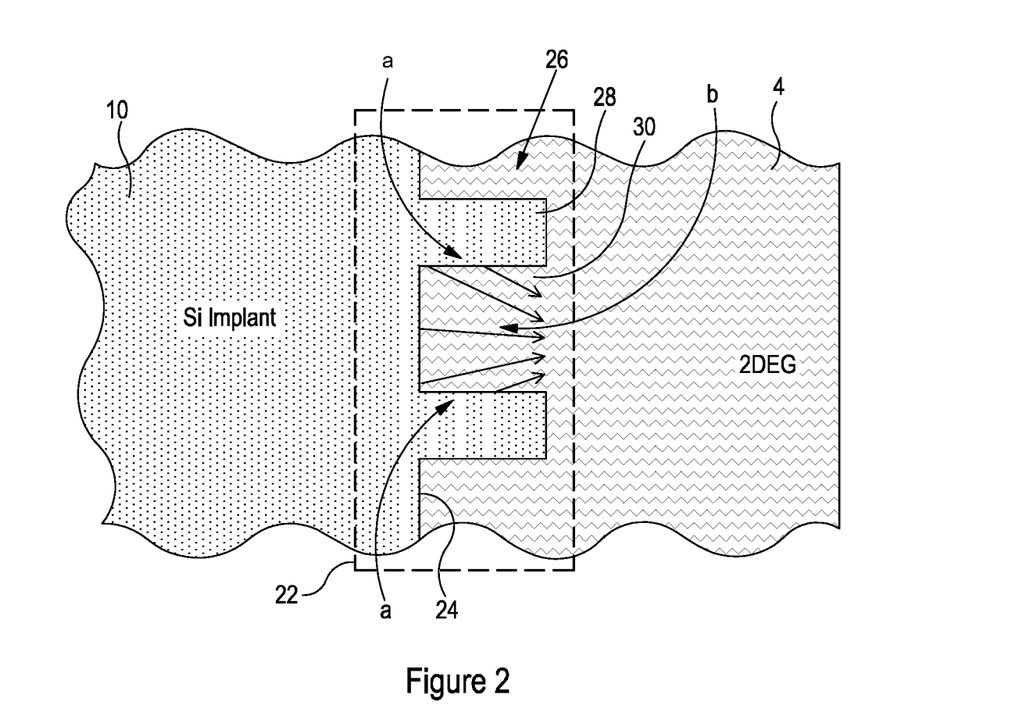
FIG. 2 shows a schematic top view cross section of a part of a contact structure according to an embodiment, wherein the interface between the silicon implant and the 2 DEG has a crenulated shape.

FIG. 2 shows a schematic top view cross section of a part of a contact structure according to an embodiment. The contact structure may be the same as that illustrated in FIG. 1. Similar or equivalent features in different figures have been given the same reference numerals to aid understanding, and are not meant to limit the illustrated embodiments. In the transition region 22 between the Si implant 10 and the 2 DEG 4, the interface 24 has a nonlinear shape 26 being a crenulated shape with peaks 28 and troughs 30. The nonlinear shape 26 is configured to reduce the total resistance of the contact structure as compared to a similar contact structure having an interface with a straight line shape. The nonlinear shape 26 increases the length of the interface 22 (for a given width of the Si implant). In this embodiment, the increase of interface length "a" will effectively reduce interface resistance, while the additional 2 DEG path length "b" (due to troughs 30) will increase the resistance compared to a linear interface. Hence, the specific height and width of the peaks 28 that provide optimal contact performance (e.g. the lowest total resistance in most applications) can be determined for a given 2 DEG sheet resistance $R_{sh}$ and nominal transition resistance $R^0_{tr}$.

Figure 3A:
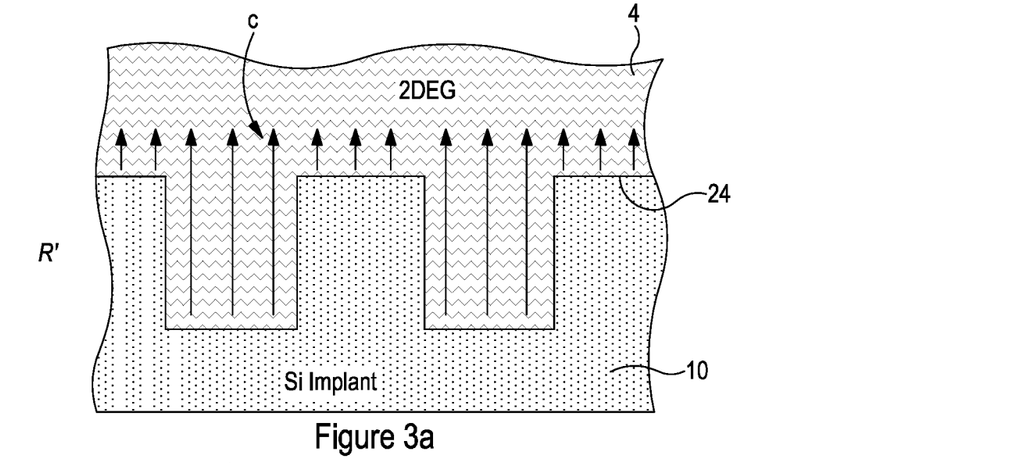
FIGS. 3a, 3b and 3c show another schematic top view cross section of a part of a contact structure according to an embodiment.
Figure 3B:
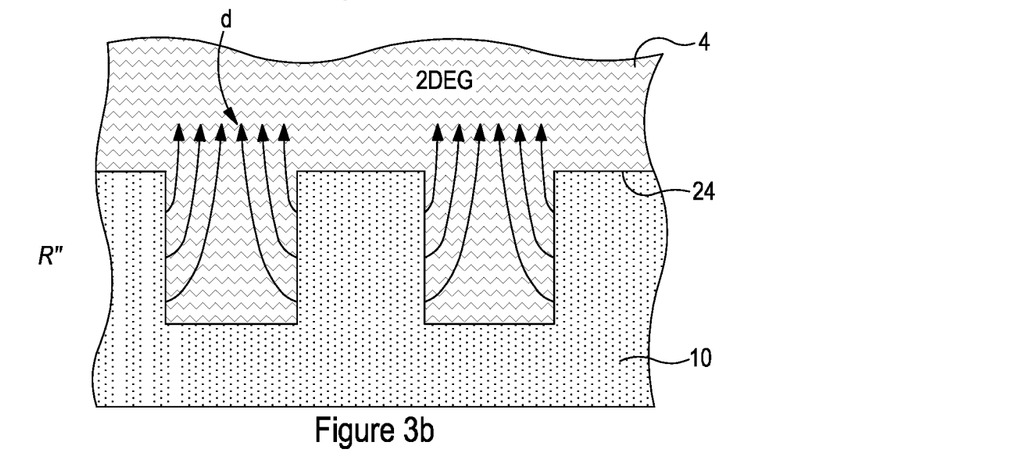
Figure 3C:
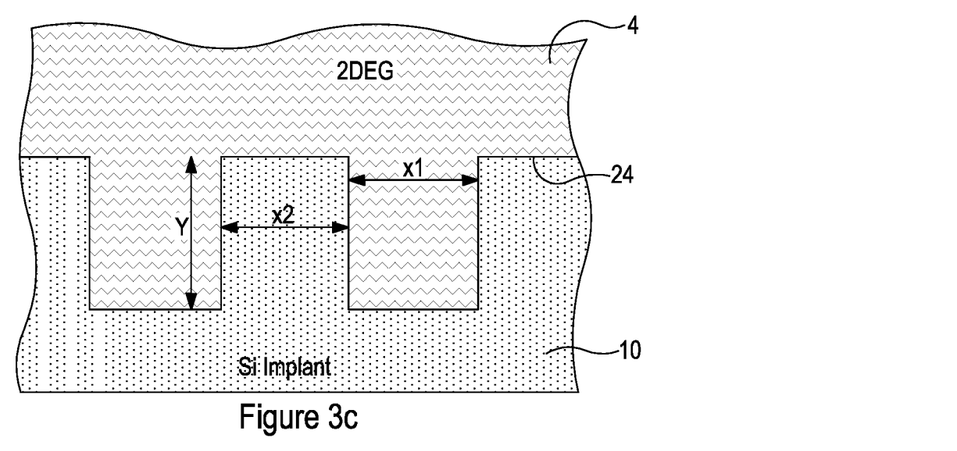

FIG. 3 shows another schematic top view cross section of a part of a contact structure according to an embodiment. The transition region between silicon implant 10 and the 2 DEG 4 can be considered as two resistors connected in parallel. FIG. 3a illustrates the first resistor R', which represents resistance attributed to the current path "c" due to the additional 2 DEG resistance provided by the increased current path length through 2 DEG (compared to a straight line interface having no troughs). FIG. 3b illustrates the second resistor R", which represents the resistance of the current path "d" due to additional interface between the Si implant and the 2 DEG due to the crenulated shape. To describe the system geometry, only three variable parameters are required: x1, x2 and Y being the width of troughs 30, the width of peaks 28, and the depth of troughs 30 respectively, as shown in FIG. 3c. Two parameters representing the process/material performance are required $R^0_{tr}$ and $R_{sh}$, being the interface resistance (for a straight line segment of the interface) and 2 DEG sheet resistance respectively. $R^0_{tr}$ may also be referred to as the nominal interface resistance, which equals the actual interface resistance $R_{tr}$ for a straight line interface. The sheet resistance of the Si implant does not have to be taken into account, since it is usually an order of magnitude smaller than that of the 2 DEG sheet resistance.

From the geometry of the crenulated shape, the resistance of R' is given by $$R' = R^0_{tr} + R_{sh}Y\frac{x_1 + x_2}{x_1}, \quad (1)$$

and the resistance of R" is given by $$R'' = \frac{R^0_{tr}}{2Y(\frac{1}{x_1 + x_2})} + \frac{R_{sh}}{2L}\frac{(x_1 + x_2)}{x_1}, \quad (2)$$

wherein L is the width of the Si implant in contact with the 2 DEG. The total resistance $R_{tot}$ is given by $$R_{tot} = \left(\frac{1}{R'} + \frac{1}{R''}\right)^{-1}. \quad (3)$$

Analytical methods and/or simulations may then be used to find the dimensions (x1, x2, and Y) which minimize $R_{tot}$.

Figure 4A:
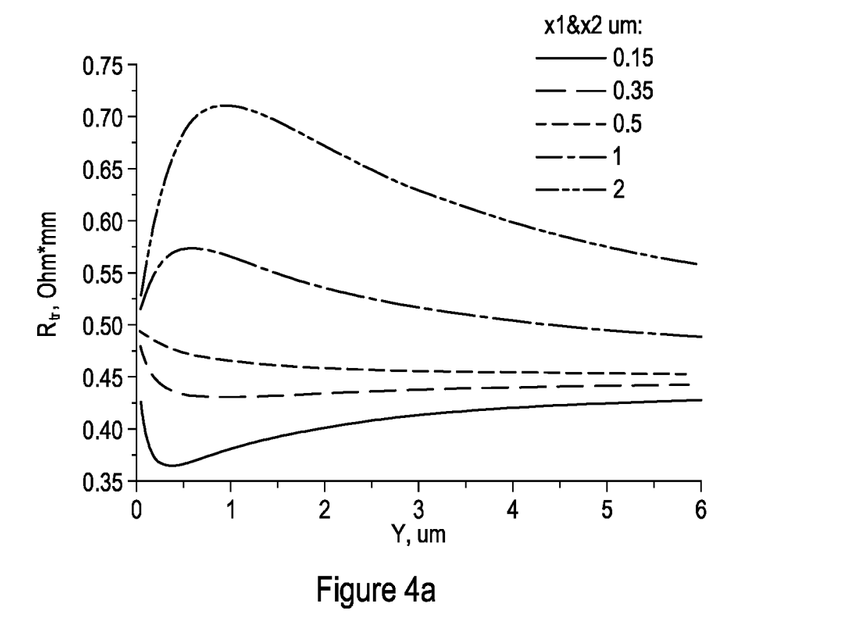
FIG. 4a shows a graph plotting the transition resistance for different dimensions of a crenulated interface shape with varying depth of troughs, wherein the width of peaks and the width of troughs are the same; different lines represent different widths of peaks and the widths of troughs.
Figure 4B:
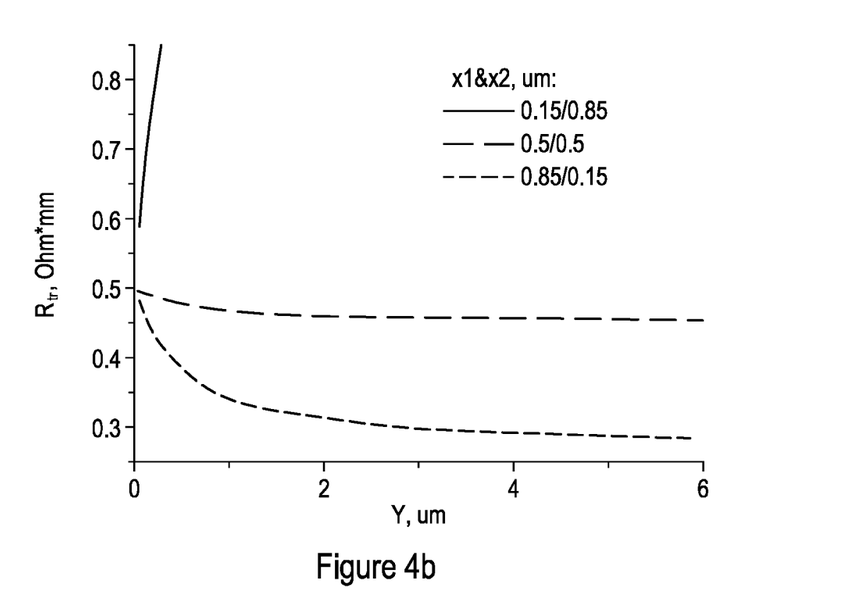
FIG. 4b shows another graph plotting the transition resistance for different dimensions of a crenulated interface shape with varying depth of troughs, demonstrating the effect of different peaks and troughs width ratio.
Figure 4C:
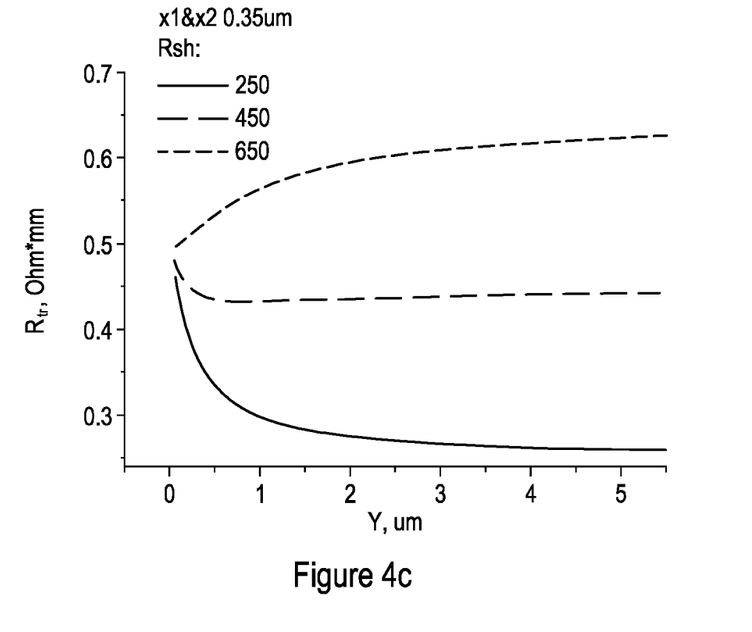
FIG. 4c shows a graph plotting the transition resistance for different 2 DEG sheet resistances, while keeping the width of the peaks and the width of the troughs fixed and varying the depth of the troughs.

FIGS. 4a to 4c show simulated curves of the transition resistance of a contact structure comprising an interface between the Si implant and the 2 DEG with a crenulated shape. For $R^0_{tr}$ and $R_{sh}$ typical values were used with $R^0_{tr}$=0.5 ohm*mm and $R_{sh}$=450 ohm/sq. For each combination of x1 and x2 the optimal Y length for a given $R_{tr}$ and $R_{sh}$ can be found as shown in FIG. 4a. For example, when both widths x1 and x2 are 0.35 μm, the optimal depth Y is about 1 μm and optimal Y is increasing with x1 and x2 size rise. For x1 greater than 1 μm (and with the given values for $R^0_{tr}$ and $R_{sh}$) there was no decrease in the total transition resistance using a crenulated shape, because the impact of additional interface length was overtaken by the 2 DEG resistance increase. For x1 and x2 both equal to 0.15 μm the total transition resistance drops from an initial 0.5 ohm*mm (for a straight line interface) down to 0.35 ohm*mm (about 30% decrease).

Figure 4D:
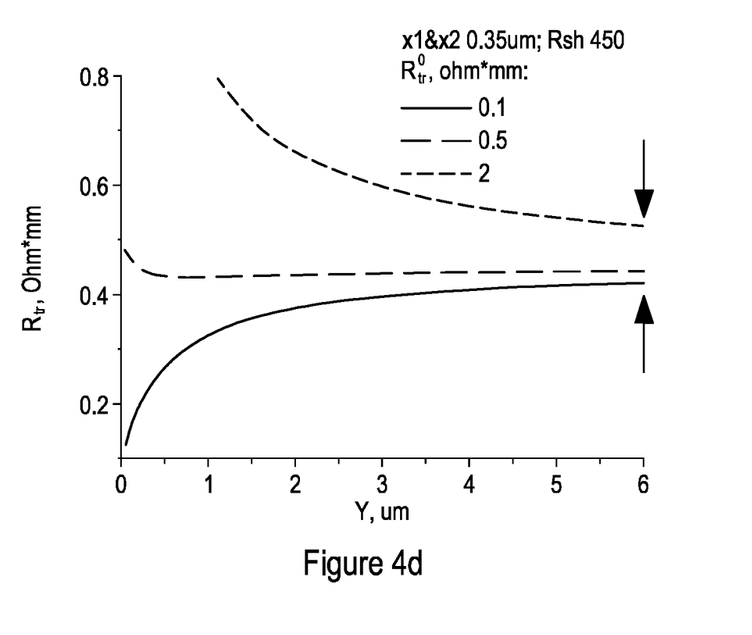
FIG. 4d shows a graph plotting the simulated transition resistance $R_{tr}$ for different nominal (straight line) transitions resistances $le_{ft}$, while keeping the width of the peaks and the width of the troughs fixed and varying the depth of the troughs.

For typical values of $R^0_{tr}$ and $R_{sh}$, an asymmetrical design (x1≠x2) can be beneficial. FIG. 4b shows that a smaller x2 compared to x1, while keeping x2+x1 constant, can further reduce resistance. From FIGS. 4c and 4d, it can be seen that changes in the 2 DEG sheet resistance $R_{sh}$ and the nominal transition resistance $R^0_{tr}$ require different combinations of dimensions to obtain an optimal design. As can be seen from FIG. 4d, where $R^0_{tr}$ varies between 0.1 ohm*mm and 2 ohm*mm (which can be the result of EPI material and/or process imperfection), the final total transition resistance $R_{tr}$ only varies between 0.42 ohm*mm and 0.52 ohm*mm. Y was set equal to =6 μm in this case. Further increase of Y can further reduce the variation in the total transition resistance.

Figure 5:
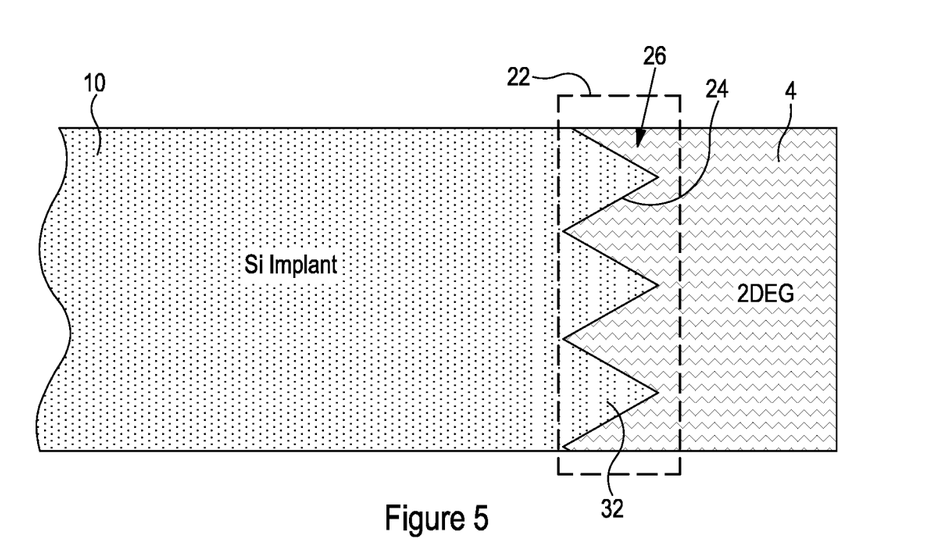
FIG. 5 shows a top view of a cross section of a part of a contact structure according to an embodiment, wherein the interface has a saw-tooth shape.
Figure 6:
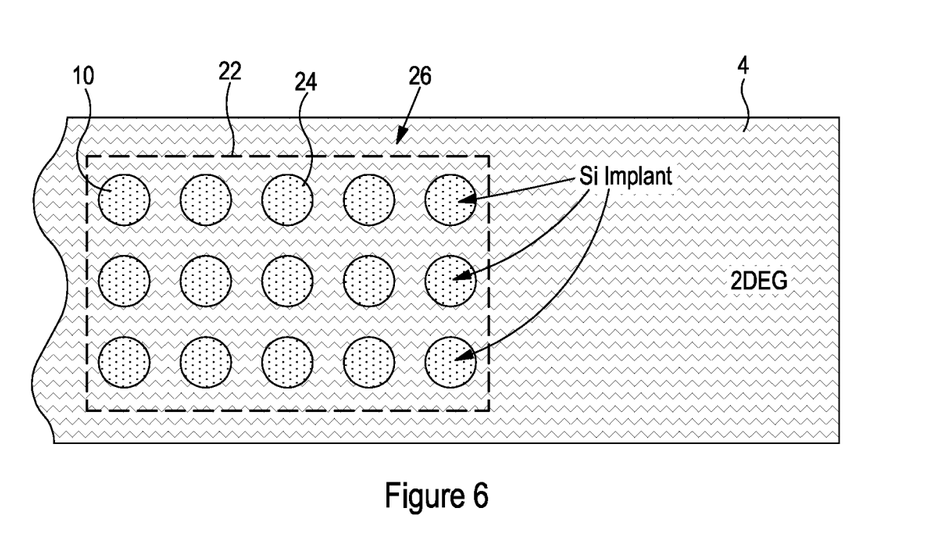
FIG. 6 shows a top view of a cross section of a part of a contact structure according to an embodiment, wherein the interface has a plurality of circular shapes.
Figure 7:
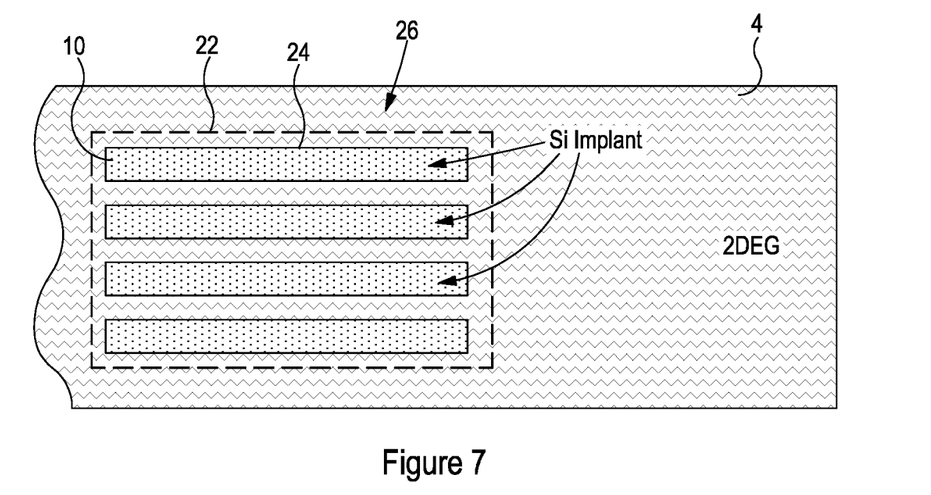
FIG. 7 shows a top view of a cross section of a part of a contact structure according to an embodiment, wherein the interface has a plurality of rectangular shapes.

FIGS. 5 to 7 show top views of cross sections of parts of contact structures according to alternative embodiments, wherein the interface 24 between the Si implant 10 and the 2 DEG 4 comprises other nonlinear shapes 26 configured to reduce the total resistance of the contact structure.

FIG. 5 shows an interface 24 having a saw-tooth shape. Each tooth 32 of the saw-tooth shape is an isosceles triangle, wherein the height and the base of the triangle can be varied based on $R^0_{tr}$ and $R_{sh}$ to optimize contact performance.

FIG. 6 shows an Si implant 10 divided into multiple separated implant regions. Each implant region has a circular shape in contact with the 2 DEG 4. Hence, the shape 26 of the interface 24 between the Si implant 10 and the 2 DEG 4 in the transition region 22 comprises multiple circular shapes. The number of implant regions, the pitch, and the diameter can be varied based on $R^0_{tr}$ and $R_{sh}$ to optimize contact performance.

FIG. 7 also shows an Si implant 10 divided into multiple separated implant regions. Each implant region has the shape of a rectangular strip in contact with the 2 DEG 4, wherein the longitudinal axis of each strip is parallel to the direction of current flow when in use. Hence, the shape 26 of the interface 24 in the transition region 22 comprises multiple rectangular shapes. The number of strips, the length, width and pitch can be varied based on $R^0_{tr}$ and $R_{sh}$ to optimize contact performance.

In general, embodiments described herein provide a contact structure comprising a 2 DEG between a first and a second semiconductor layer (e.g. typically group-III nitride layers), a silicon implant extending through or into at least a part of the first semiconductor layer and into at least a part of the second semiconductor layer and connected to the 2 DEG along an interface between the 2 DEG and the silicon implant, wherein the interface has a nonlinear shape. The structure further comprises a contact (typically an Ohmic contact) connected to the 2 DEG via the silicon implant. The silicon implant may be formed by, for example, Ga: Si overgrowth after AlGaN Ohmic opening recess, or by Si ion implantation. The metal contact can cover the whole or a part of the silicon implant.

The nonlinear shape may comprise a crenulated shape, wherein the crenulated shape can comprise one or more troughs (filled with the 2 DEG) between consecutive peaks (of the Si implant), the troughs having a first width and a depth and the peaks having a second width. The first width may be less than 1 μm and the depth may be in the range of 0.2 μm to 6 μm, in order to reduce the resistance of the contact structure. The lower end of the range may be limited by the fabrication process, typically being a CMOS process. The second width can be substantially equal to the first width, and the depth may be in the range of 0.1 μm to 1.5 μm.

Other nonlinear shapes of the interface that reduce the total resistance of the contact structure (compared to a straight line interface) may be used. For example, the nonlinear shape may comprise one of a saw-toothed shape (for example comprising isosceles triangles), a plurality of circular shapes (where the Si implant is divided into multiple implant regions), and a plurality of rectangular shapes (where the Si implant is divided into multiple implant regions). Typically the rectangular shapes are rectangular strips having a longitudinal axis parallel the direction of current flow. The dimensions of the shapes can be chosen based on simulated and/or analytical models to optimize contact performance (e.g. by minimizing the resistance) for a given transition resistance and 2 DEG sheet resistance.

The first and/or the second semiconductor layer is typically a group-III nitride layer, which provide the 2 DEG between them. The first semiconductor layer may comprise a layer of AlGaN, AlN, InGaAlN or another group-III nitride that is different from the second semiconductor layer. The second semiconductor layer may comprise a layer of GaN, AlGaN, InGaAlN or another group-III nitride. Further layers can be grown above the first semiconductor layer, such as another group-III nitride or SiN. The group-III nitride layers are generally epitaxially grown and typically in a CMOS process.

The non-linear shape typically extends over at least 75% of the length of said interface. For example, in an embodiment where the silicon implant has a rectangular shape, the non-linear shape of the interface may extend across at least 75% of one side of that rectangular shape. In general, the non-linear shape may be located along a side substantially perpendicular to the direction of current travel when the contact is in use. The 2 DEG is generally substantially planar and extends across a plane, wherein the non-linear shape is non-linear along a direction lying substantially in, or extending substantially parallel with, the plane. The non-linear shape is ideally located such that the current path from/to the contact, when in use, crosses the non-linear shape of the interface.

While specific embodiments of the invention have been described above, it will be appreciated that the invention may be practiced otherwise than as described. The embodiments are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A semiconductor contact structure comprising:
   a two-dimensional electron gas (2DEG) between a first semiconductor layer and a second semiconductor layer;
   a silicon implant extending into at least part of the first semiconductor layer and into at least part of the second semiconductor layer and connected to said 2DEG along an interface between said 2DEG and said silicon implant, wherein said interface has a nonlinear shape; and
   a contact connected to said 2DEG via said silicon implant wherein said nonlinear shape comprises a crenulated shape and wherein said crenulated shape comprises one or more troughs between consecutive peaks in the Si implant, said troughs having a first width and a depth and said peaks having a second width, wherein said first width is less than 1 μm and said depth is in the range of 0.1 μm to 6 μm.

2. The semiconductor contact structure according to claim 1, wherein said second width is substantially equal to said first width and said depth is in the range of 0.3 μm to 1.5 μm.

3. The semiconductor contact structure according to claim 1, wherein at least one of said first semiconductor layer and said second semiconductor layer is a group-III nitride layer.

4. The semiconductor contact structure according to claim 3, wherein said first semiconductor layer comprises an aluminum gallium nitride (AlGaN) layer.

5. The semiconductor contact structure according to claim 3, wherein said second semiconductor layer comprises a gallium nitride (GaN) layer.

6. The semiconductor contact structure according to claim 3, wherein said first semiconductor layer comprises one of aluminum nitride (AlN) and indium aluminum gallium nitride (InAlGaN).

7. The semiconductor contact structure according to claim 3, wherein said second semiconductor layer comprises one of aluminum gallium nitride (AlGaN), aluminum nitride (AlN), and indium aluminum gallium nitride (InAlGaN).

8. The semiconductor contact structure according claim 1, wherein said contact covers a part but not a whole of said silicon implant.

9. The semiconductor contact structure according to claim 1, wherein said contact covers a whole of said silicon implant.

10. The semiconductor contact structure according to claim 1, wherein said non-linear shape extends over at least 75% of the length of said interface.

11. The semiconductor contact structure according to claim 1, wherein said silicon implant has a substantially rectangular shape, and said non-linear shape extends across at least 75% of the length of one side of said substantially rectangular shape.

12. The semiconductor contact structure according to claim 1, wherein said 2DEG is substantially planar and extends across a plane, and wherein said non-linear shape is non-linear along a direction lying substantially in, or extending substantially parallel with, said plane.

13. The semiconductor contact structure according to claim 1 and comprising a third semiconductor layer on said first semiconductor layer.

14. The semiconductor contact structure according to claim 13, wherein said third semiconductor layer is a group-III nitride layer or a silicon nitride (SiN) layer.

15. The semiconductor contact structure according to claim 1, wherein said contact is an Ohmic contact.

\* \* \* \* \*

UNITED STATES PATENT AND TRADEMARK OFFICE
CERTIFICATE OF CORRECTION

PATENT NO. : 11,923,445 B2
APPLICATION NO. : 17/237763
DATED : March 5, 2024
INVENTOR(S) : Victor Sizov

Page 1 of 1

It is certified that error appears in the above-identified patent and that said Letters Patent is hereby corrected as shown below:

On the Title Page (73) Assignee reads:
"...X-FAB DRESDENT GMBH & CO. KG..."
Should read:
--...X-FAB DRESDEN GMBH & CO. KG...--

Signed and Sealed this
Twenty-fourth Day of September, 2024

Katherine Kelly Vidal
*Director of the United States Patent and Trademark Office*